(12) United States Patent
Moronval et al.

(10) Patent No.: US 8,369,053 B2
(45) Date of Patent: Feb. 5, 2013

(54) DISCHARGE PROTECTION APPARATUS AND METHOD OF PROTECTING AN ELECTRONIC DEVICE

(75) Inventors: Xavier Moronval, Toulouse (FR); Cedric Cassan, Chandler, AZ (US); Jeffrey Jones, Tempe, AZ (US); Olivier Lembeye, Plaisance du Touch (FR)

(73) Assignee: Freescale Semiconductor, Inc., Austin, TX (US)

( * ) Notice: Subject to any disclaimer, the term of this patent is extended or adjusted under 35 U.S.C. 154(b) by 653 days.

(21) Appl. No.: 12/295,467

(22) PCT Filed: Mar. 31, 2006

(86) PCT No.: PCT/EP2006/004038
§ 371 (c)(1),
(2), (4) Date: Sep. 30, 2008

(87) PCT Pub. No.: WO2007/112770
PCT Pub. Date: Oct. 11, 2007

(65) Prior Publication Data
US 2011/0038087 A1    Feb. 17, 2011

(51) Int. Cl.
*H02H 9/00* (2006.01)
(52) U.S. Cl. .......................................... 361/56; 361/111
(58) Field of Classification Search .................... 361/56, 361/111
See application file for complete search history.

(56) References Cited

U.S. PATENT DOCUMENTS

| | | | |
|---|---|---|---|
| 5,105,172 A * | 4/1992 | Khatibzadeh et al. | 333/175 |
| 6,137,352 A * | 10/2000 | Germann | 327/601 |
| 6,885,534 B2 | 4/2005 | Ker et al. | |
| 6,894,324 B2 | 5/2005 | Ker et al. | |
| 6,894,567 B2 | 5/2005 | Vickram et al. | |
| 6,911,739 B1 * | 6/2005 | Jin et al. | 257/784 |
| 7,002,220 B1 | 2/2006 | Jin et al. | |
| 7,221,550 B2 * | 5/2007 | Chang et al. | 361/118 |
| 2005/0122644 A1 | 6/2005 | Ma et al. | |
| 2005/0184344 A1 | 8/2005 | Ker et al. | |

FOREIGN PATENT DOCUMENTS
JP    11067486 A    3/1999

* cited by examiner

*Primary Examiner* — Rexford Barnie
*Assistant Examiner* — Tien Mai

(57) ABSTRACT

A protection circuit apparatus comprises an electrostatic discharge circuit coupled to an isolation filter. The isolation filter comprises an inductor coupled to a ground-coupled capacitor, the inductor and the capacitor being coupled to the electrostatic discharge circuit. The inductor is also coupled to an electrostatic discharge sensitive device to be protected from an electrostatic discharge event.

20 Claims, 3 Drawing Sheets

DISCHARGE PROTECTION APPARATUS AND METHOD OF PROTECTING AN ELECTRONIC DEVICE

FIELD OF THE INVENTION

This invention relates to a discharge protection apparatus of the type that, for example, protects an electronic device from an electrostatic discharge event. This invention also relates to a method of protecting an electronic device of the type, for example, that is exposed to an electrostatic discharge event.

BACKGROUND OF THE INVENTION

Electrostatic Discharge (ESD) events are occurrences of high electrical potentials of limited energy that can damage a gate oxide of a Field Effect Transistor (FET) by forcing electrical currents to flow through the gate oxide. The flow of the electrical current through the gate oxide can weaken the gate oxide, or the potential can even be sufficiently large to rupture the gate oxide resulting in a so-called "gate short", or low resistance path to another terminal of the FET. ESD events can be caused by electrostatic discharge from a human body or machines, for example a wafer saw during manufacture of a circuit containing the FET.

To protect the FET, it is known to provide an ESD protection circuit comprising a positive turn-on voltage clamp and a negative turn-on voltage clamp. The positive turn-on voltage clamp is designed to sink ESD current at a preset voltage (and above). In most known ESD protection circuits, whilst the design of the positive turn-on voltage clamp requires considerable attention, the negative turn-on voltage clamp is simply designed to sink ESD current at any voltage below a breakdown voltage of the FET. Typically, the negative turn-on voltage clamp is configured as a reverse-biased diode. A terminal of the ESD protection circuit is coupled to a node associated with the FET to be protected, the node being known, herein, as a protected node.

Among the various RF circuits in existence, power amplifiers have stringent requirements in relation to both ESD protection and RF performance. One example of a power amplifier having such protection and performance requirements is a so-called Laterally Diffused Metal Oxide Semiconductor (LDMOS) power amplifier. For LDMOS power amplifiers, it is known to employ ESD protection circuits comprising a first LDMOS transistor coupled to a source load in a cascode arrangement. The source load comprises a resistor coupled in parallel with a second LDMOS transistor, the second LDMOS transistor being in a grounded-gate configuration. The first LDMOS transistor has a patterned Lightly Doped Drain (LDD) to provide a greater Breakdown Drain Voltage (BVDSS) than provided by a conventional ESD protection structure having a gate and a drain terminal of a FET coupled together. The first LDMOS transistor also reduces a capacitance presented to the protected node. When a positive ESD event occurs, the source load limits current during initial stages of the positive ESD event. In this respect, the load seen at the source terminal of the first LDMOS transistor is a relatively high resistance, R, limiting current flowing through the first LDMOS transistor when the voltage across the first LDMOS transistor is greatest. As current increases, the source voltage of the first LDMOS transistor rises, eventually triggering the diode, formed by coupling the gate and the drain of the second transistor together, to conduct when a negative voltage swing occurs. Consequently, the source to drain PN junction (diode) of the first LDMOS transistor starts to conduct current when around −0.5 Volts is applied across the source to drain PN junction of the first LDMOS transistor.

For LDMOS amplifier circuits, the ESD protection circuit is directly connected to a gate of an LDMOS transistor of the LDMOS amplifier circuit to be protected, i.e. the protected node. Consequently, the ESD protection circuit is held at the same potential as the gate of the LDMOS transistor. When ESD protection circuits were initially designed, typical gate bias voltages for so-called "class AB" operation of LDMOS technology was 4V. As LDMOS technology has evolved, each new generation of LDMOS transistor has had a lower gate threshold voltage than previous generations. In this respect, a typical gate bias voltage for class AB operation for the latest generation of LDMOS transistors is currently 2.5V. For applications for Doherty or so-called "class B" and "class C" amplifiers, the gate bias voltage can be even lower, for example the gate bias voltage can be as low as 1V. For gate bias voltages of 2.5V and below, as RF input drive signal levels increase, gate potential swing can become negative and reach −0.5V and below. This results in current flowing through the gate of the LDMOS transistor of the LDMOS amplifier circuit and hence either poor RF circuit performance due to clipping of the RF input drive signal or outright failure of the ESD protection circuit, because a high level of current is shunted through the ESD protection circuit so as to cause the ESD protection circuit to fail, i.e. fuse.

STATEMENT OF INVENTION

According to the present invention, there is provided a discharge protection apparatus and a method of protecting an electronic device as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
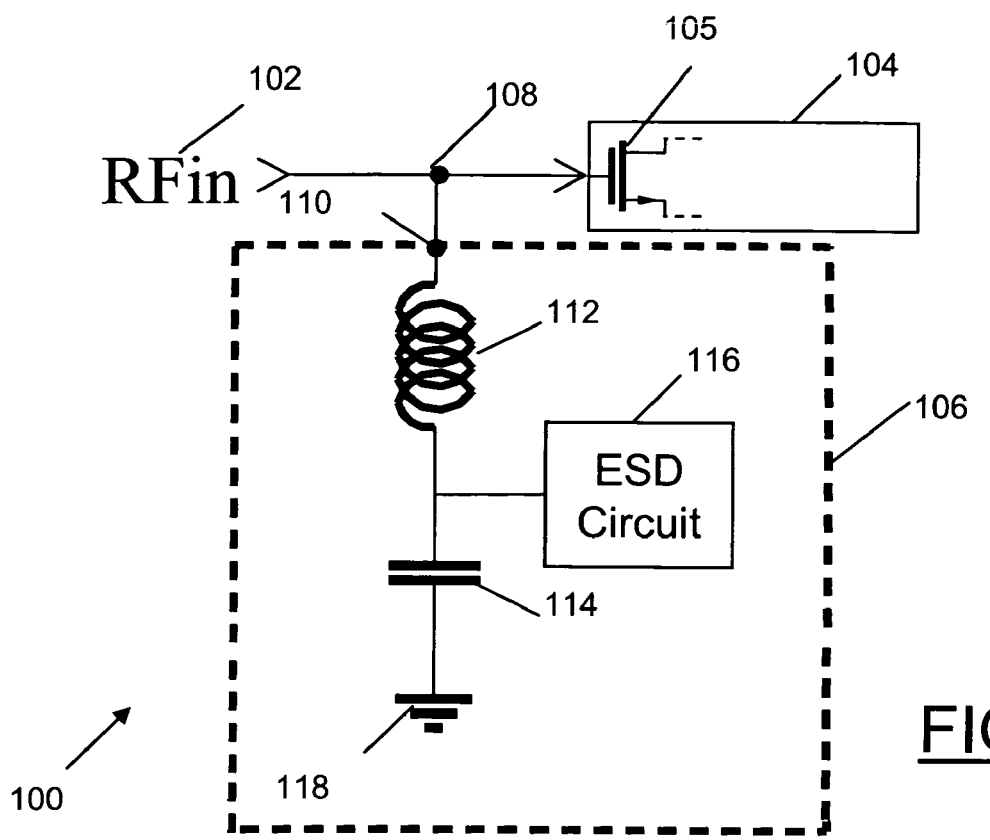
FIG. 1 is a circuit diagram of an apparatus constituting a first embodiment of the invention.

Throughout the following description identical reference numerals will be used to identify like parts.

Referring to FIG. 1, an electronic circuit 100 comprises an input 102 for receiving an RF signal, for example as provided by an emitter circuit of a base station (not shown) or a Node B (also not shown) in a communications network. The input 102 is coupled to a Radio Frequency (RF) processing circuit, where the RF signal is subjected to, amongst other things, an amplification circuit 104. In this example, the amplification circuit 104 is a power amplifier that employs an LDMOS Field Effect Transistor (FET) 105. However, the skilled person should be aware that other circuits and/or transistor technologies can be employed.

In order to protect the RF circuit 100 from an ElectroStatic Discharge (ESD) event, a protection circuit 106 apparatus is coupled between the input 102 and the RF amplification circuit 104 at a first, protected, node 108. The protection circuit 106 comprises an ESD input 110 coupled to the first node 108 and an isolation filter having a first inductor 112 coupled to a capacitor 114. The capacitor 114 is coupled to ground potential 118, and the first inductor 112 of the isolation filter is also coupled to an ESD circuit 116.

Figure 2:
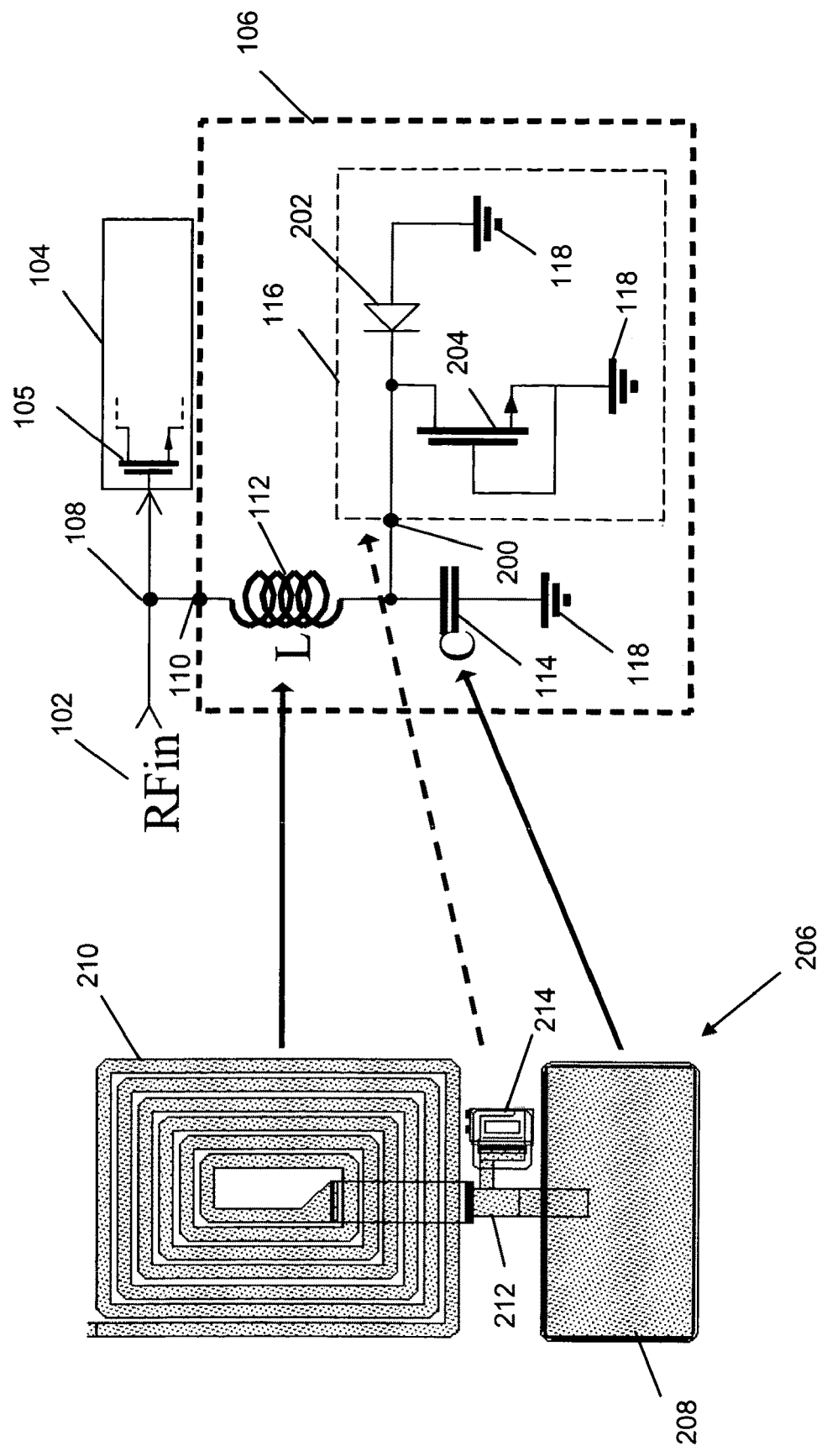
FIG. 2 is a schematic diagram of an implementation of the apparatus of FIG. 1.

The ESD circuit 116 can be any known suitable ESD protection circuit. In this example, and referring to FIG. 2, the ESD circuit 116 comprises a second ESD input 200 coupled to a cascode arrangement of a first LDMOS transistor 202 and a second LDMOS transistor 204. A cathode of a PN junction, formed by connecting a gate of the first LDMOS transistor 202 to a drain of the first LDMOS transistor 202, is coupled to the second ESD input 200. An anode of PN junction of the first LDMOS transistor 202 is coupled to the ground potential 118. The second ESD input 200 is also coupled to a drain terminal of the second LDMOS transistor 204, the second LDMOS transistor 204 having a gate terminal and a source terminal thereof both coupled together and to the ground potential 118.

The protection circuit 106 is formed as an integrated circuit 206 in which the capacitor is an integrated capacitor 208 of, for example, 40 pF coupled to an integrated spiral inductor 210 of, for example, 8 nH, the integrated capacitor 208 being coupled to the integrated spiral inductor 210 by an integrated transmission line connection 212. The ESD circuit 116 is an integrated ESD circuit 214 also coupled to the integrated transmission line connection 212.

In operation, a sinusoidal input signal, $V_{gs}$, is applied at the input 102 for exemplary purposes, and has a Direct Current (DC) offset or bias voltage of 2.5V. In this example, the sinusoidal input signal, $V_{gs}$, has a peak-to-peak amplitude of 7V. Whilst the ESD circuit 116 provides ESD protection to the amplification circuit 104 through normal operation, a negative swing of the sinusoidal input signal, $V_{gs}$, is not clipped at voltages of −0.5V and below, and hence performance of the power amplifier, in particular, the power output-gain characteristic of the power amplifier is not clipped.

In this respect, for negative voltages of −0.5V and below, the first inductor 112 and the capacitor 114 serve to earth a sinusoidal signal present at the second ESD input 200 to ground potential 118, thereby preventing current being drawn through the ESD circuit 116 and hence avoiding modification to the DC offset voltage of the sinusoidal input signal, $V_{gs}$. Consequently, the ESD circuit 116 is isolated from the RF component of the sinusoidal input signal, $V_{gs}$, by the isolation filter.

Figure 4:
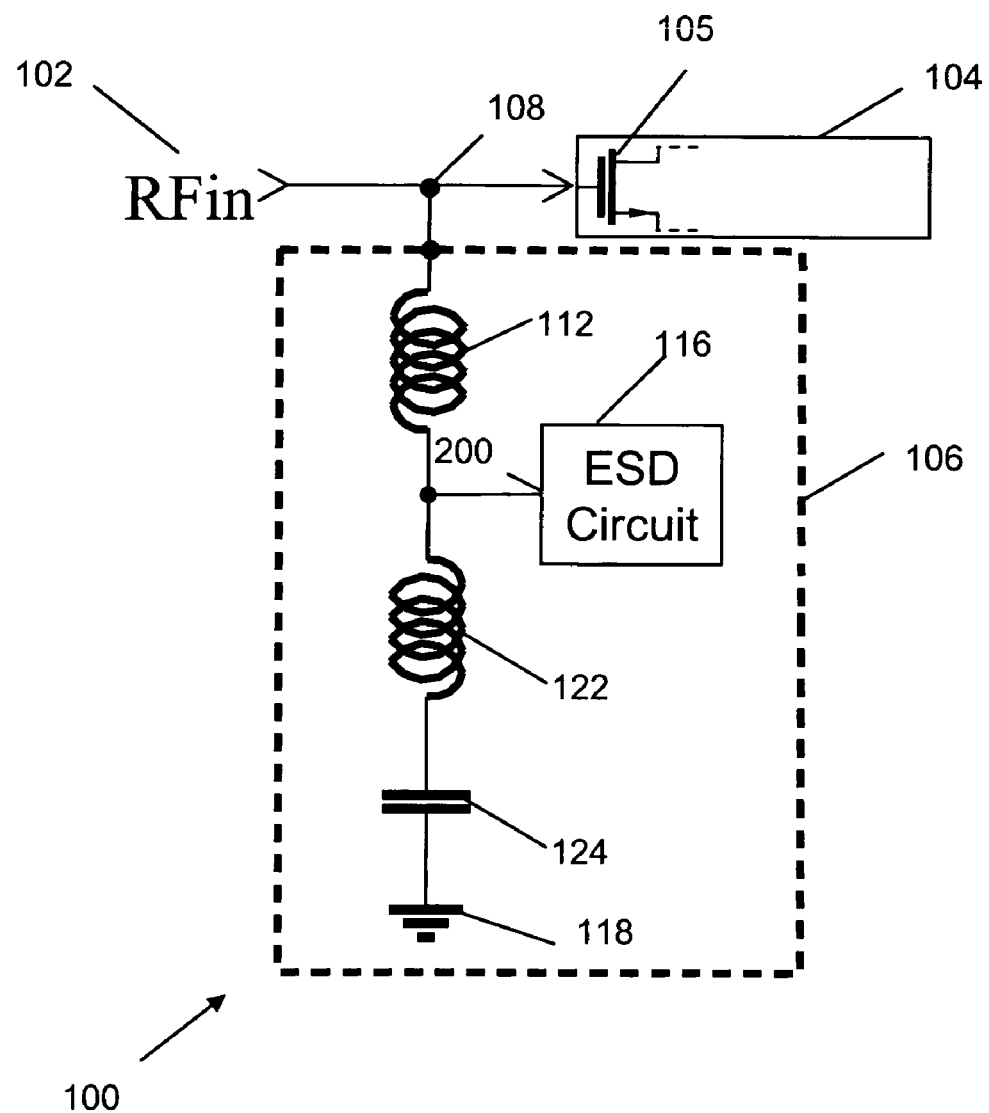
FIG. 4 is a circuit diagram of another apparatus constituting a second embodiment of the invention.

Turning to FIG. 4, in another embodiment, a second inductor 122 is coupled between the first inductor 112 and a second capacitor 124 so that the first inductor 112 and the second ESD input 200 of the ESD circuit 116 are both coupled to one terminal of the second inductor 122 and another terminal of the inductor is coupled to the second capacitor 124. The LC configuration described above constitutes a filter network, more particularly an LC filter network. In this example, the isolation filter comprises a notch filter.

In operation, the LC isolation circuit effectively provided by the first and second inductors 112, 122 and the second capacitor 124 provide the same functionality as the first inductor 112 and the first capacitor 114 in relation to prevention of clipping to the sinusoidal input signal, $V_{gs}$. However, the second inductor 122 and the second capacitor 124 constitute, as mentioned above, the notch filter, the resonant frequency of the notch filter substantially corresponding to at least the operating frequency of the power amplifier, and so over the operating frequency of the power amplifier, the notch filter serves to short-circuit RF signals to the ground potential 118. Due to the selective nature of the notch filter, the physical area that the second capacitor 124 occupies on a semiconductor die is smaller than that of the first capacitor 114 used in the first embodiment described above.

Figure 3:
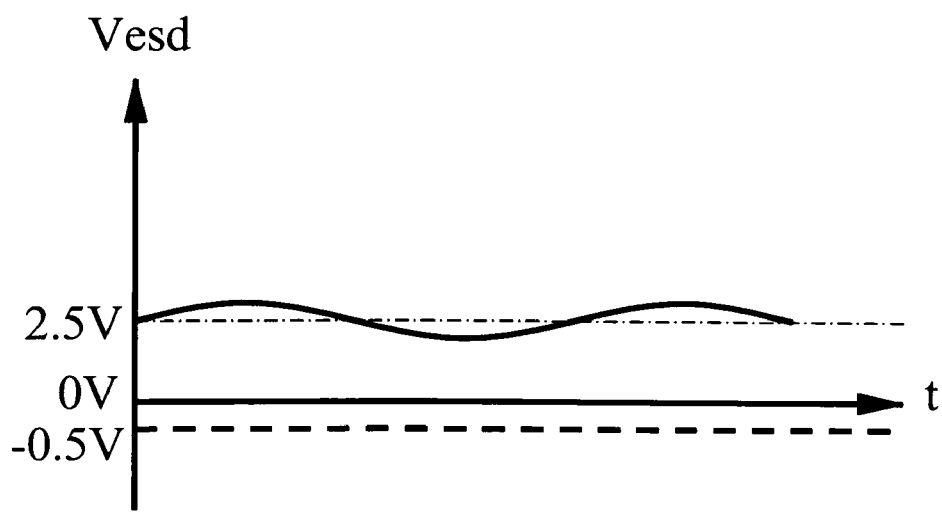
FIG. 3 is a graph of performance of the apparatus of FIG. 1.

Referring to FIG. 3, the voltage applied to the second ESD input 200, as a result of use of the isolation filter between the power amplifier and the ESD protection circuit 116 of the above embodiments, has a considerably smaller peak-to-peak voltage swing. The PN junction of the first LDMOS transistor 202 is therefore prevented from attaining a negative turn-on voltage that results in current being drawn through the gate of the power amplifier and hence the clipping mentioned above.

Although use of the spiral integrated inductor 210 has been described above to serve as the first inductor 112, the first inductor 112 and/or the second inductor 122 can be realised by a first bond wire and/or a second bond wire, respectively.

It is thus possible to provide an apparatus and method that does not interfere with processing of an RF input signal. In particular, a negative voltage clamp turn-on voltage of the PN junction of the ESD protection circuit is not attained, irrespective of gate bias voltage of a transistor device to which the apparatus is coupled. Hence, the RF input signal does not undergo clipping, nor does the ESD protection circuit fail due to the quantum of current being shunted through the ESD protection circuit. Further, the apparatus is compatible with different types of ESD protection circuit employed in the apparatus and is agnostic to RF voltage swings.

The invention claimed is:

1. A discharge protection apparatus comprising:
    a protection circuit for protecting an electronic device from an electrostatic discharge event, wherein the electronic device is a switching device, the protection circuit includes:
        a transistor having a first current electrode, a second current electrode coupled to a ground potential, and a control electrode coupled to the second current electrode; and
        a diode having a cathode terminal coupled to the first current electrode of the transistor, and an anode terminal coupled to the ground potential; and
    an isolation filter for coupling to the electronic device to be protected, the isolation filter being coupled to the protection circuit so as to isolate an input of the protection circuit from an RF signal component without preventing the protection circuit from providing protection from an occurrence of the electrostatic discharge event, the isolation filter comprises:
        a first inductor having a first terminal coupled to a terminal of the electronic device, and a second terminal coupled to the first current electrode of the transistor of the protection circuit;
        a second inductor having a first terminal coupled to the second terminal of the first inductor and to first current electrode of the transistor of the protection circuit, and a second terminal; and
        a capacitor having a first terminal coupled to the second terminal of the second inductor, and a second terminal coupled to the ground potential.

2. An apparatus as claimed in claim 1, wherein the switching device is a transistor.

3. An apparatus as claimed in claim 2, wherein the capacitor is a shunt capacitor, the first inductor being coupled to ground via the shunt capacitor.

4. An apparatus as claimed in claim 2, wherein the isolation filter is a filter network.

5. An apparatus as claimed in claim 1, wherein the capacitor is a shunt capacitor, the first inductor being coupled to ground via the shunt capacitor.

6. An apparatus as claimed in claim 1, wherein the isolation filter is a filter network.

7. An apparatus as claim in claim 6, wherein the filter network is an L-C network.

8. An apparatus as claimed in claim 7, wherein the capacitor is a shunt capacitor, the first inductor being coupled to ground via the shunt capacitor.

9. An apparatus as claimed in claim 1, wherein the first inductor and/or the second inductor is a bond wire.

10. An apparatus as claimed in claim 1, wherein the electronic device is a Field Effect Transistor.

11. An integrated circuit comprising:
an electronic device to be protected;
a discharge protection apparatus to provide protection to the electronic device from an occurrence of an electrostatic discharge event; and
an isolation filter to isolate an input of the discharge protection apparatus from an radio frequency signal component without preventing the discharge protection apparatus from providing protection from the occurrence of the electrostatic discharge event, the isolation filter comprises:
 a first inductor having a first terminal coupled to a terminal of the electronic device and to an input of the integrated circuit, and a second terminal coupled to a terminal of the discharge protection apparatus;
 a second inductor having a first terminal coupled to the second terminal of the first inductor and to the terminal of the discharge protection apparatus, and a second terminal, wherein the second inductor couples the discharge protection apparatus to a ground potential via a first signal path that does not include the first inductor; and
 a capacitor having a first terminal coupled to the second terminal of the second inductor, and a second terminal coupled to a ground potential.

12. A circuit as claimed in claim 11, wherein the electronic device is a switching device.

13. A circuit as claimed in claim 11, wherein the electronic device is a Field Effect Transistor.

14. An apparatus as claimed in claim 11, wherein the capacitor is a shunt capacitor, the first inductor being coupled to ground via the shunt capacitor.

15. An apparatus as claimed in claim 11, wherein the isolation filter is a filter network.

16. An apparatus as claimed in claim 11, wherein the first inductor and/or the second inductor is a bond wire.

17. A method of protecting an electronic device from an electrostatic discharge event, the method comprising the steps of:
 providing a protection circuit to protect the electronic device from the electrostatic discharge event;
 isolating an input of the protection circuit from the electronic device so as to isolate the protection circuit from an RF signal component without preventing the protection circuit from providing protection from an occurrence of the electrostatic discharge event;
 isolating the input of the protection circuit from the electronic device using a first inductor having a first terminal coupled to a terminal of the electronic device and to an input for receiving the RF signal component, and a second terminal coupled to a terminal of the protection circuit, a second inductor having a first terminal coupled to the second terminal of the first inductor and to the terminal of the protection circuit, and a second terminal, wherein the second inductor couples the protection circuit to a ground potential via a first signal path that does not include the first inductor, and a capacitor having a first terminal coupled to the second terminal of the second inductor, and a second terminal coupled to the ground potential.

18. An apparatus as claimed in claim 17, wherein the isolation filter is a filter network.

19. An apparatus as claimed in claim 17, wherein the electronic device is a switching device.

20. The method of claim 17, wherein the first inductor and/or the second inductor is a bond wire.

* * * * *